United States Patent
Sasser et al.

(10) Patent No.: US 7,284,916 B2
(45) Date of Patent: Oct. 23, 2007

(54) DUAL STAGE MODULAR OPTICAL DEVICES WITH INSERT DIGITAL DIAGNOSTICS COMPONENT

(75) Inventors: Gary Sasser, San Jose, CA (US); Chris K. Togami, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 305 days.

(21) Appl. No.: 11/151,900

(22) Filed: Jun. 13, 2005

(65) Prior Publication Data

US 2005/0285236 A1 Dec. 29, 2005

Related U.S. Application Data

(60) Provisional application No. 60/579,121, filed on Jun. 11, 2004.

(51) Int. Cl.
*G02B 6/36* (2006.01)
*H04B 10/00* (2006.01)
(52) U.S. Cl. .......................... 385/92; 385/93; 398/135; 398/140; 398/161; 398/164
(58) Field of Classification Search ................ 398/128, 398/130, 135, 138–141, 164
See application file for complete search history.

(56) References Cited

U.S. PATENT DOCUMENTS

2002/0114588 A1* 8/2002 Golwalkar et al. ........... 385/88

* cited by examiner

*Primary Examiner*—Michelle Connelly-Cushwa
*Assistant Examiner*—Chris Chu
(74) *Attorney, Agent, or Firm*—Workman Nydegger (57) ABSTRACT

Embodiments of the present invention are directed to dual stage modular optical devices with insert digital diagnostics components. A first portion of a leadframe couples a first fabricated package including a light source and/or light detector to a second fabricated package with first opening for receiving inserts. A second portion of the leadframe couples the second fabricated package to a third fabricated package with a second opening for receiving inserts. A first component insert is coupled to the second fabricated package such that components of the first component insert can electrically interoperate with the light source and/or light detector. A second component insert is coupled to the third fabricated package such that components of the second component insert can electrically interoperate with components of the first component insert to implement digital diagnostics functions.

37 Claims, 6 Drawing Sheets

DUAL STAGE MODULAR OPTICAL DEVICES WITH INSERT DIGITAL DIAGNOSTICS COMPONENT

CROSS-REFERENCE TO RELATED APPLICATIONS

The present invention claims priority to U.S. Provisional patent application Ser. No. 60/579,121, entitled "Dual Stage Modular Optical Devices With Insert Digital Diagnostics Components", filed on Jun. 11, 2004, the entire contents of which are incorporated herein by reference.

BACKGROUND OF THE INVENTION

1. The Field of the Invention

The present invention is generally related to optical devices used in fiber optic communications systems. More particularly, the present invention provides for dual stage modular optical devices with insert digital diagnostics components.

2. The Relevant Technology

Fiber optic technology is increasingly employed as a method by which information can be reliably transmitted via a communications network. Networks employing fiber optic technology are known as optical communications networks, and are marked by high bandwidth and reliable, high-speed data transmission.

Optical communications networks employ optical transceivers in transmitting information via the network from a transmission node to a reception node. Generally, such optical transceivers implement both data signal transmission and reception capabilities. For example, a transmitter portion of a transceiver is configured to convert an incoming electrical data signal into an optical data signal and a receiver portion of the transceiver is configured to convert an incoming optical data signal into an electrical data signal.

More particularly, an optical transceiver at the transmission node receives an electrical data signal from a network device, such as a computer, and converts the electrical data signal to a modulated optical data signal using an optical transmitter such as a laser. The optical data signal can then be transmitted in a fiber optic cable via the optical communications network to a reception node of the network. At the reception node, the optical data signal is received at another optical transceiver that uses a photodetector, such as a photodiode, to convert the received optical data signal back into an electrical data signal. The electrical data signal is then forwarded to a host device, such as a computer, for processing.

Generally, multiple components are designed to accomplish different aspects of these functions. For example, an optical transceiver can include one or more optical subassemblies ("OSA") such as a transmit optical subassembly ("TOSA"), and a receive optical subassembly ("ROSA"). Typically, each OSA is created as a separate physical entity, such as a hermetically sealed cylinder that includes one or more optical sending or receiving components, as well as electrical circuitry for handling and converting between optical and electrical signals. Within the optical transceiver, each OSA generally includes electrical connections to various additional components such as a transceiver substrate, sometimes embodied in the form of a printed circuit board ("PCB"). OSAs in a conventional transceiver are generally oriented such that a longitudinal axis defined by the OSA is substantially parallel to the transceiver substrate. The transceiver substrate, in turn, is mounted to the board of a host bus adapter ("HBA") or other component.

The transceiver substrate can include multiple other active circuitry components particularly designed to drive or handle electrical signals sent to or returning from one or more of the OSAs. Accordingly, such a transceiver substrate will usually include a number of electrical transmission lines with the one or more OSAs. Such connections may include "send" and "receive" data transmission lines for each OSA, one or more power transmission lines for each OSA, and one or more diagnostic data transmission lines for each OSA. These transmission lines are connected between the transceiver substrate and the OSA using different types of electrical connectors, examples of which include an electrical flex circuit, a direct mounting connection between conductive metallic pins extending from the OSA and solder points on the PCB, and a plug connection that extends from the PCB and mounts into electrical extensions from an OSA.

As part of ongoing efforts to uniformly reduce the size of optical transceivers and other components, manufacturing standards such as the small form factor ("SFF"), small form factor pluggable ("SFP"), and 10 gigabit small form factor pluggable ("XFP") standards have been developed. Nonetheless, the size of most optical transceivers, even those that comply with such manufacturing standards, best suits them for external connections to a computer system, such as a desktop computer, a laptop computer, or a handheld digital device.

For example, an SFF or SFP optical transceiver can be used to provide an interface between an optical cable and a standard network cable, such as an Ethernet cable for example, that plugs into a computer system. Alternatively, a number of optical transceivers can be mounted in a network panel and configured to include an external connection to a computer system. However, the number of components within a conventional transceiver, as well as the orientation and the size of SFF or SFP optical transceivers, makes it difficult, if not impossible, to integrate conventional optical transceivers into smaller spaces, such as within a pluggable card for use in a laptop computer or hand held device. For example, despite their relatively compact nature, conventional SFF, SFP, and XFP optical transceiver bodies are still too wide and/or tall to fit within a typical PCMCIA laptop envelope.

A related problem concerns the connections of the optical transceiver. In particular, use of the optical transceiver as an external, rather than internal, component necessitates the use of additional connectors and connections, which increase both the overall cost associated with the system as well as the complexity of the system. As well, optical transceivers employed in an external, rather than integrated, configuration are more prone to rough handling and damage than an integrated component.

Furthermore, even if the conventional optical transceiver could fit within such an envelope, the length of the conventional SFF, SFP, or XFP optical transceiver is such that the transceiver substrate takes up an inordinate amount of board space on a corresponding host bus adapter ("HBA") or other component to which the optical transceiver is attached. This problem is of particular concern in light of the concurrent demands for increases in functionality and decreases in component size. These, and other, considerations make conventional optical transceivers less than ideal for integration within many computer systems. Accordingly, what would be advantageous are reduced cost optical transceivers that can fit within relatively small envelopes such that the optical transceiver can be integrated within compact components and various computing systems and devices.

BRIEF SUMMARY OF THE INVENTION

The foregoing problems with the prior state of the art are overcome by the principles of the present invention, which are directed to dual stage modular optical devices with insert digital diagnostics components. A first fabricated package includes at least one of a light source for generating optical signals and a light detector for detecting received optical signals. A second fabricated package includes a first opening for receiving component inserts. A first leadframe portion mechanically connects the first fabricated package to the second fabricated package and electrically connects the at least one of the light source and light detector in the first fabricated package to first contacts of the first leadframe portion exposed in the first opening. A first component insert is mechanically coupled to the second fabricated package and electrically coupled to the exposed first contacts such that components of the first component insert can electrically interoperate with the at least one of the light source and light detector.

A third fabricated package includes a second opening for receiving component inserts. A second leadframe portion mechanically connects the second fabricated package to the third fabricated package and electrically connects the first exposed contacts to second contacts of the second leadframe portion exposed in the second opening. A second component insert is mechanically coupled to the third fabricated package and electrically coupled to the exposed second contacts such that components of the second component insert can electrically interoperate with components of the first component insert to implement digital diagnostics functions.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to dual stage modular optical devices with insert digital diagnostics components. A first fabricated package includes at least one of a light source for generating optical signals and a light detector for detecting received optical signals. A second fabricated package includes a first opening for receiving component inserts. A first leadframe portion mechanically connects the first fabricated package to the second fabricated package and electrically connects the at least one of the light source and light detector in the first fabricated package to first contacts of the first leadframe portion exposed in the first opening. A first component insert is mechanically coupled to the second fabricated package and electrically coupled to the exposed first contacts such that components of the first component insert can electrically interoperate with the at least one of the light source and light detector.

A third fabricated package includes a second opening for receiving component inserts. A second leadframe portion mechanically connects the second fabricated package to the third fabricated package and electrically connects the first exposed contacts to second contacts of the second leadframe portion exposed in the second opening. A second component insert is mechanically coupled to the third fabricated package and electrically coupled to the exposed second contacts such that components of the second component insert can electrically interoperate with components of the first component insert to implement digital diagnostics functions.

In general, embodiments of the present invention describe modular optical devices (e.g., TOSAs and ROSAs) that can be integrated within the relatively small physical envelopes defined by compact components, such as a Host Bus Adapter ("HBA"). Embodiments of the present invention can interoperate with a desktop computer, a laptop computer, or other similar computer system, while maintaining compliance with applicable operational and performance standards.

As used herein, "OSA" refers to any one of a transmit optical subassembly ("TOSA") or a receive optical subassembly ("ROSA"). Further, a "substrate" refers to a printed circuit board ("PCB") having electrically conductive elements such as circuit traces for transmitting power and/or communication signals between components of a modular optical device and another system or device, such as a computer system. A transceiver PCB (e.g., a Host Bus Adapter) can include circuits, devices and systems for facilitating the operation and control of the modular optical device. Such circuits, devices and systems include, but are not limited to, a laser driver, a post amplifier, and transimpedance amplifier.

Embodiments of the present invention include a dual stage fabricated leadframe package (hereinafter referred to as a "dual stage fabricated package") with digital diagnostics insert package. The dual stage fabricated package includes a first fabricated package and a second fabricated package. One or more first leadframe portions can mechanically couple the first fabricated package to the second fabricated package and electrically couple components included in the first fabricated package to contacts exposed in the second fabricated package. One or more second leadframe portions can mechanically couple the second fabricated package to the digital diagnostics insert package and electrically couple contacts exposed in the second fabricated package to contacts exposed in the digital diagnostics insert package. Accordingly, components in the first, second, and digital diagnostics insert packages can interoperate to implement digital diagnostics functions.

The first fabricated package can include a light source (e.g., vertical cavity surface emitting laser ("VCSEL")) and/or light detector (e.g., photodiode) as well as corresponding openings for transmitting and receiving optical signals. The light source and light detector can be wire bonded to portions of leadframes that extend into the first fabricated package. This allows the light source and light detector to be electrically connected to other components, for example, in the second fabricated package and/or in the digital diagnostics insert package, that are also connected to the leadframes.

The second fabricated package includes exposed contacts for electrically connecting to active and/or passive circuitry components for driving the light source (e.g., a laser driver), converting a received light signal (e.g., transimpedance amplifier), or for implementing other optical signal processing. Such other components can be component inserts accepted within the second fabricated package. These other components can be, for example, PCBs, ceramic substrates, silicon substrates, glass substrates, and other leadframe-based (possibly insert-molded) substrates that include packaged ICs, bare ICs, and/or passive SMT components.

PCB or other component inserts accepted within the second fabricated package can be wire bonded to contacts exposed at the second fabricated package. Accordingly, circuitry components on a PCB or other component insert can be electrically coupled (via the one or more first leadframe portions) to the light source and/or light detector. For example, a PCB or other component insert can include die attached and/or wire bonded integrated circuits. Integrated circuits of a component insert can be epoxy glob topped or capped for protection. An assembled PCB or other component insert can also include surface mount components. A PCB or other component insert can be mechanically coupled to the second fabricated package using an adhesive, such as, for example epoxy.

The digital diagnostics insert package also includes exposed contacts for electrically connecting to a diagnostic component insert having active and/or passive circuitry for implementing digital diagnostics functions, such as, for example, providing (potentially real-time) diagnostic information about a transceiver's operating conditions (power, current, voltage, wavelength and temperature monitoring), generating diagnostic data by digitizing analog transceiver signals, internally or externally calibrating a transceiver, issuing alarms and warnings (e.g., based on specified power, current, voltage, wavelength and temperature thresholds), retrieving vendor information, and querying a transceiver for supported features (encoding, bit rate, etc). Such other components can be included on component inserts as previously described. Circuitry components for implementing digital diagnostics functions can include a processor for executing instructions as well as Random Access Memory ("RAM") and/or Read-Only Memory ("ROM") for storing and retrieving instructions and data values. Exposed connections of a diagnostic component insert can be wire bonded to contacts exposed within the digital diagnostics insert package.

PCB or other component inserts accepted within the digital diagnostics package can be wire bonded to contacts exposed at the digital diagnostics package. Accordingly, circuitry components on the diagnostic component insert can be electrically coupled (via the one or more second leadframe portions) to the contacts exposed at the second fabricated package. Component inserts accepted within a digital diagnostics package can be mechanically coupled to the digital diagnostics package, protected, and configured as previously described The digital diagnostics insert package can also include an external connection, such as, for example, one or more third leadframe portions in a thru hole pin or formed lead configuration, for connecting (e.g., surface mounting) the dual stage fabricated package with digital diagnostics insert package to a Printed Circuit Board Assembly ("PCBA") or a Host Bus Adapter ("HBA"). When active and/or passive circuitry is included on component inserts, there is a reduced (and potentially no) need to duplicate such circuitry on the PCBA. Accordingly, the size of an HBA can be reduced.

Embodiments of the dual stage fabricated package with digital diagnostics insert package can be mechanically coupled to a lens block that includes receptacles for accepting one or more lens pins. For example, a lens block can be configured to accept a transmission lens pin, a reception lens pin, or a combination of transmission lens pins and/or reception lens pins. Accepted lens pins can be mechanically coupled to the lens block. Lens pins mechanically coupled to the lens block can provide appropriate receptacles for receiving external optical connections. Lens pins can include lenses that focus optical signals.

Accordingly, a lens included in a (transmission) lens pin can direct a generated optical signal from the dual stage fabricated package with digital diagnostics insert package to an external component (e.g., an optical cable). On the other hand, a lens included in a (reception) lens pin can direct a received optical signal from an external component to the dual stage fabricated package with digital diagnostics insert package. For example, an optical signal generated at a laser included in the first portion of the dual stage fabricated package can be transferred through the lens block, transferred through a lens in a corresponding transmission lens pin, to a corresponding optical cable. Likewise, an optical signal received from an optical cable can be transferred through a lens in a corresponding reception lens pin, transferred through the lens block, into a corresponding photodiode in the first portion of the dual stage fabricated package.

A dual stage fabricated package with digital diagnostics insert package, a lens block, and one or more lens pins can be passively or actively aligned to optimize optical signal strength. Dual stage fabricated packages, digital diagnostics insert packages, lens blocks, and lens pins can be fabricated (e.g., molded, machined, cast, etc.) from plastic, metal, or any other suitable material that will allow for alignment of such components relative to one another. A dual stage fabricated package, a digital diagnostics insert package, a lens block, and one or more lens pins can be mechanically coupled using a variety of coupling means, such as, for example, adhesive, metal clips, staples, laser welding, barbed pin, etc. Laser welding can be particularly advantageous when components (e.g., a lens block and a portion of a dual stage fabricated package with digital diagnostics insert package) are made of similar plastic compounds. Accordingly, a modular optical device, such as, for example, an OSA, can include, a dual stage fabricated package, a digital diagnostics insert package, one or more component inserts, a lens block, and one or more lens pins.

Figure 1A:
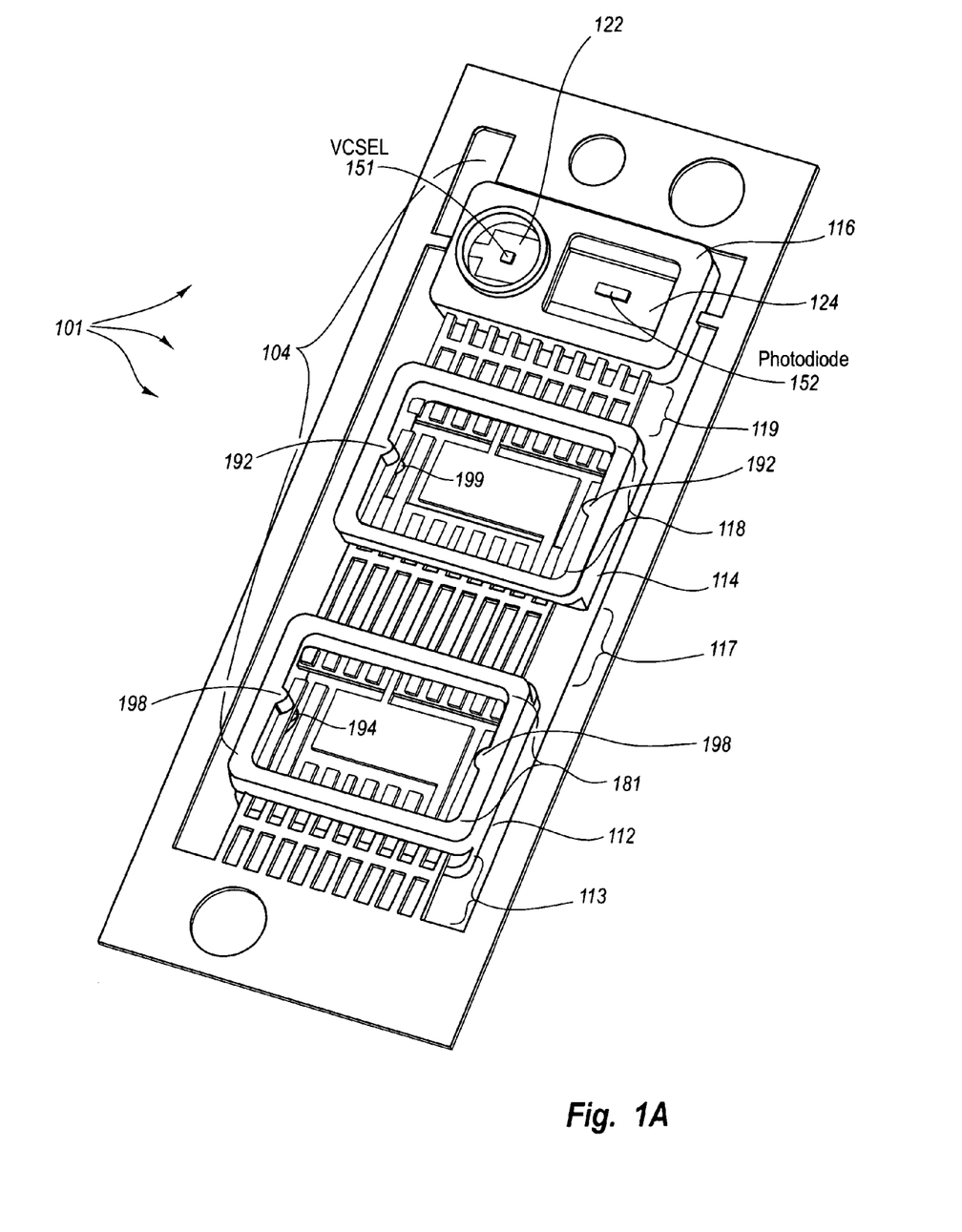
FIG. 1A illustrates an example leadframe including components of an example dual stage fabricated package with digital diagnostics insert package.

FIG. 1A illustrates an example leadframe 101 including components of an example dual stage fabricated package with digital diagnostics insert package 104. As depicted, dual stage fabricated package with digital diagnostics insert package 104 includes fabricated package 116 and fabricated package 114 (the combination being dual stage fabricated package) and fabricated package 112. Fabricated package 116 and fabricated package 114 are mechanically and electrically connected by leadframe portion 119. Similarly, fabricated package 114 and fabricated package 112 are mechanically and electrically connected by leadframe portion 117.

Fabricated package 116 further includes transmission opening 122 for transmitting generated optical signals. For example, VCSEL 151 (Vertical Cavity Surface Emitting Laser) can transmit optical signals out of transmission opening 122. Fabricated package 116 also includes detector opening 124 for detecting received optical signals. For example, photodiode 152 can detect optical signals received at detector opening 124. Components included in fabricated package 116 can be wire bonded to contacts of leadframe 101, for example, to contacts of portion 119. Accordingly, a light source and photo detector in fabricated package 116 can be electrically coupled to circuitry in or connected to fabricated package 114.

Fabricated package 114 includes insert opening 118 that can accept component inserts having Integrated Circuits ("ICs") or surface mount components that include active and/or passive circuitry (e.g., circuitry of a laser driver) A component insert can be wired bonded to contacts of leadframe 101, for example, to the metal contacts within insert opening 118. Component inserts can be secured to fabricated package 114 with epoxy. ICs can be protected by epoxy globbing, potting, by attaching a cover over insert opening 118, or by incorporating a cover into a lens holding clip. A component insert accepted at fabricated package 114 can include active and/or passive circuitry components for driving a light source (e.g., a laser driver), converting a received light signal (e.g., transimpedance amplifier), or for implementing other optical signal processing. For example, circuitry of a component insert can interoperate with components (e.g., a laser or photo diode) in fabricated package 116 (via leadframe portion 119) to send and/or receive optical signals.

Fabricated package 112 includes insert opening 181 that can accept component inserts having Integrated Circuits ("ICs") or surface mount components that include active and/or passive circuitry. Component inserts can be electrically and mechanically coupled to fabricated package 112 and protected as previously described. A component insert accepted at fabricated package 112 can include active and/or passive circuitry components for performing diagnostic functions or for implementing other optical signal processing. For example, circuitry of a component insert can interoperate with components (e.g., of other component inserts) in fabricated package 114 (via leadframe portion 117) to implement diagnostic functions. Thru other leadframe portions (e.g., leadframe portion 119) component inserts accepted at fabricated package 112 can also interoperate with components in fabricated package 116 to send and/or receive optical signals.

Fabricated package 112 can also be mechanically connected to a portion of leadframe 101, for example, leadframe portion 113, that provides mechanical and/or electrical connections to external components. External connections can be, for example, thru hole, gull-wing, hot bar style, etc. It may be that portion 113 is connected (both electrically and mechanically) to a Printed Circuit Board Assembly ("PCBA") or a Host Bus Adapter ("HBA"). For example, portion 113 can be used to surface mount fabricated package 112 to a PCBA. Accordingly, components included in fabricated package 116 can be electrical connected to components in fabricated package 114 (through portion 119), further electrically connected to components in fabricated package 112 (through portion 117), and further electrically connected to external components (through portion 113).

In some embodiments, a corrosive resistant coating is used to protect components, such as, for example, VCSEL 151 and photodiode 152, in fabricated packages 112, 114, and 116. For example, a diluted silicone mixture can be used to coat the components of fabricated packages 112, 114, and 116.

Figure 1B:
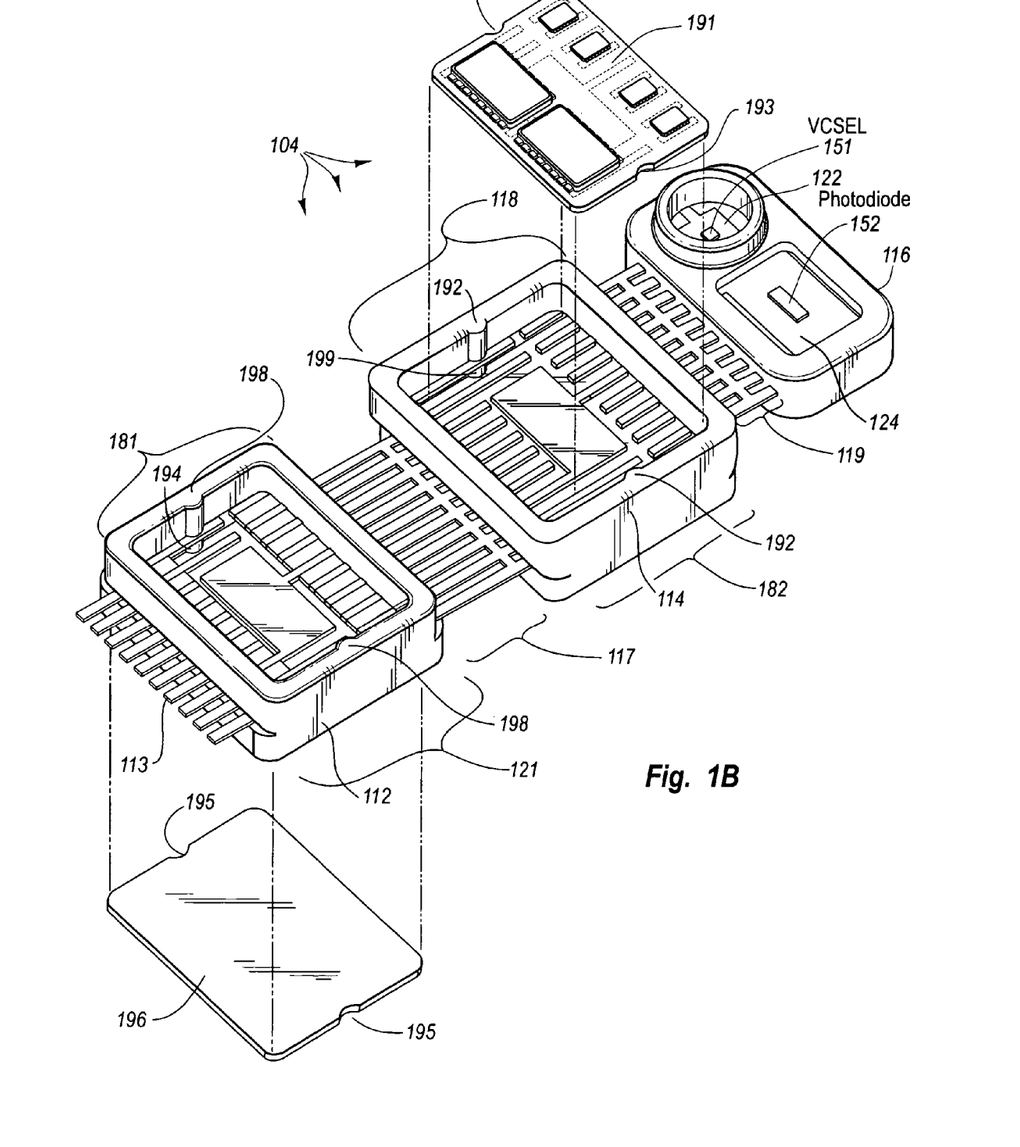
FIG. 1B illustrates components of the example dual stage fabricated package with digital diagnostics insert package in a fully open configuration relative to corresponding component inserts.

FIG. 1B illustrates components of the example dual stage fabricated package with digital diagnostics insert package 104 in a fully open configuration relative to corresponding printed circuit board inserts 191 and 196. The fully open configuration in FIG. 1B may result from trimming dual stage fabricated package with digital diagnostics insert package 104 from leadframe 101. For example, tooling of a (computerized or otherwise automated) component assembly system can be programmed to trim dual stage fabricated package with digital diagnostics insert package 104 from leadframe 101.

Tooling of a (computerized or otherwise automated) component assembly system can also be programmed to appropriately insert PCB insert 191 into insert opening 118 (in the depicted orientation of FIG. 1B the top side of fabricated package 114). Alignment features 192 and alignment slots 193 facilitate proper alignment of PCB insert 191 during insertion into insert opening 118. After insertion into insert opening 118, electrical contacts of PCB insert 191 can be wire bonded to exposed contacts in insert opening 118 to cause circuitry of PCB insert 191 to be electrically coupled (via portion 119) to components included in fabricated package 116. Also after insertion into insert opening 118, epoxy can be used to mechanically secure PCB insert 191 to fabricated package 114.

Tooling of a (computerized or otherwise automated) component assembly system can also be programmed to appropriately insert PCB insert 196 (e.g., a diagnostic PCB insert) into insert opening 121 (in the depicted orientation of FIG. 1B the bottom side of fabricated package 112). Alignment features 194 and alignment slots 195 facilitate proper alignment of PCB insert 196 during insertion into insert opening 121. After insertion into insert opening 121, electrical contacts of PCB insert 196 can be wire bonded to exposed contacts in insert opening 121 to cause circuitry of PCB insert 196 to be electrically coupled (via portion 117) to components included in fabricated package 114. Also after insertion into opening 121, epoxy can be used to mechanically secure PCB insert 196 to fabricated package 112.

Further, it should be understood that additional PCB inserts can be accepted into insert opening 182 (in the depicted orientation of FIG. 1B the bottom side of fabricated package 114) and into insert opening 181 (in the depicted orientation of FIG. 1B the top side of fabricated package 112). These additional PCB inserts can be secured and protected as previously described. For example, alignment features 199 can facilitate proper insertion of a PCB insert into insert opening 182. Likewise, alignment features 198 can facilitate proper insertion of a PCB insert into insert opening 181.

Additionally, although PCB inserts have been described, it should be understood that insert openings 118, 121, 181, and 182 are not limited to accepting PCB inserts. That is, other types of component inserts, such as, for example, ceramic substrates, silicon substrates, glass substrates, and other leadframe-based (possibly insert-molded) substrates can also be accepted at any of insert openings 118, 121, 181, and 182. For example, it may be that a glass substrate is inserted into insert opening 118. Embodiments also include insertion of different types of component inserts into different insert openings. For example, a silicon substrate insert (with appropriate alignment slots) can be accepted at insert opening 118 and a ceramic substrate insert (with appropriate alignment slots) can be accepted at insert opening 182 (or vice versa). Tooling of a (computerized or otherwise automated) component assembly system can be programmed to insert component inserts into fabricated packages 112 and 114 where and when appropriate.

Fabricated packages 112, 114, and 116 can be fabricated at the same time thereby reducing the costs of manufacturing dual stage fabricated package with digital diagnostics insert package 104. Once assembled, dual stage fabricated package with digital diagnostics insert package 104 is a low cost, reduced form factor transceiver. For example, dual stage fabricated package with digital diagnostics insert package 104 can be mechanically coupled to other components to facilitate OSA functionality, for example, as part of an optical transceiver.

Figure 2A:
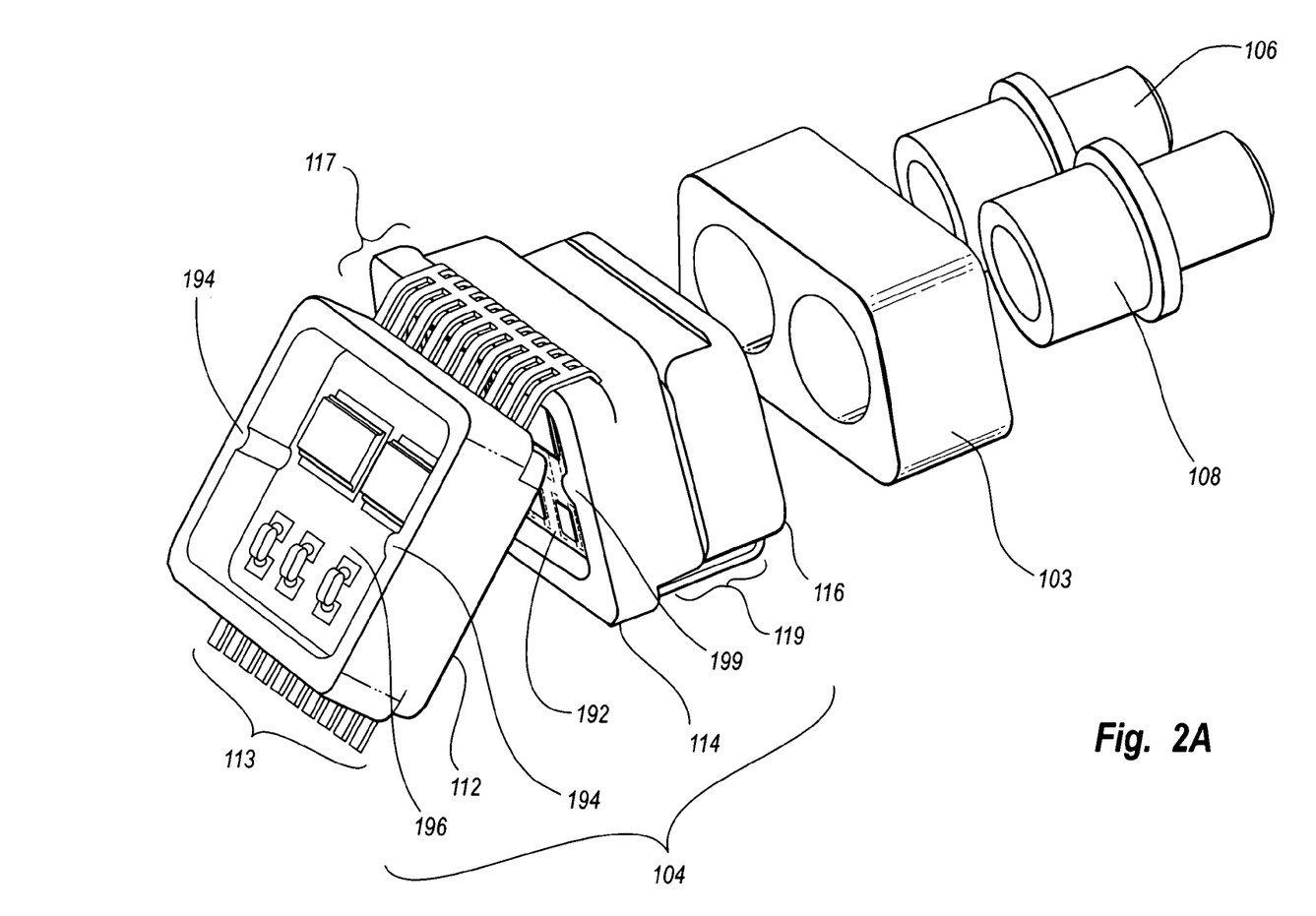
FIG. 2A illustrates an example dual stage fabricated package with digital diagnostics insert package including corresponding component inserts in a partially formed configuration relative to other optical components.

FIG. 2A illustrates an example dual stage fabricated package with digital diagnostics insert package 104 including corresponding printed circuit boards 191 and 196 in a partially formed configuration relative to lens block 103 and lens pins 108 and 106. The partially formed configuration in FIG. 2A may result from partially bending leadframe portions 119 and 117. For example, tooling of a (computerized or otherwise automated) component assembly system can be programmed to partially bend leadframe portions 117 and 119 resulting in the partially formed configuration of FIG. 2A.

Lens block 103 can include corresponding receptacles for accepting lens pins. Each of the lens pins 108 and 106 can include a corresponding lens element that facilitates the transfer (transmission or reception) of optical signals. For example, lens pin 108 can be positioned and aligned over transmission opening 122 such that generated optical signals (e.g., from VCSEL 151) are transmitted out the end of lens pin 108. Similarly, lens pin 106 can be positioned and aligned over reception opening 124 such that received optical signals are directed at a corresponding photo detector (e.g., detected by photodiode 152).

A lens block may or may not include lens elements. For example, in some embodiments, lens elements are included in appropriate receptacles based on lens block configuration. In other embodiments, no receptacles include lens elements.

In some embodiments, lens elements are included at various different locations within a lens pin. For example, lens elements can potentially be included at one or more lens element locations in lens pins 106 and 108.

As previously described, components of a modular optical device can be passively or actively aligned. Passive alignment can include assembling components that were manufactured within specified tolerances such that assembling the components causes the components to be aligned. For example, passive alignment can include obtaining a lens block including a transmitting lens pin and a receiving lens pin, each of the lens pins being configured to receive a fiber optic cable that is capable of carrying optical signals. Passive alignment can also include obtaining a dual stage fabricated package with insert digital diagnostics component that includes a light emitting component and a light detecting component. Passive alignment can also include passively aligning the light emitting component with a lens in the transmitting receptacle by attaching the lens block to the dual stage fabricated package with insert digital diagnostics component such that a specified optical power from the light emitting component through the transmitting receptacle can be achieved.

Active alignment can include adjusting the position of components that are lightly held together such that optical signal strength is optimized and then more permanently fixing the position of the components. For example, active alignment can include aligning a lens pin, a lens block, and a dual stage fabricated package with insert digital diagnostics component in a first direction, a second direction, and a third direction such that the signal strength of optical signals transferred between a lens included in the lens pin and the dual stage fabricated package is optimized. Active alignment can also include mechanically coupling the lens pin to the lens block to fix the position of the lens pin relative to the dual stage fabricated package in the first direction. Active alignment can also include subsequent to mechanically coupling the lens pin to the lens block, re-aligning the lens block and the dual stage fabricated package in the second and third directions such that the signal strength of optical signals transferred between the lens pin and the dual stage fabricated package is again optimized. Active alignment can also include mechanically coupling the lens block to the dual stage fabricated package to fix the position of the lens block relative to the dual stage fabricated package in the second and third directions.

In some embodiments, optimizing signal strength includes aligning components such that the output signal strength is maximized. In other embodiments, optimizing signal strength includes aligning components such that the output signal strength closely approximates a pre-selected signal strength (e.g., that is some amount less than the maximum possible output signal strength). Optimizing signal strength to a pre-selected level can include determining the alignment that maximizes signal strength and then "backing off" from the maximum by a fixed amount in a controlled manner.

Generally, dual stage fabricated package with digital diagnostics insert package 104 and other corresponding components can be used in modular optical devices of various form factors, including, but not limited to, an SFF, SFP, and XFP optical transceiver. Accordingly, digital diagnostics functionality can be implemented in relatively small form factor devices. The foregoing are exemplary however, and modular optical devices can be implemented in various other smaller form factor devices well. Further, embodiments of the invention are suitable for use in connection with a variety of data rates such as about 1 Gbps, about 2 Gbps, about 4 Gbps, and about 10 Gbps, or higher.

Figure 2B:
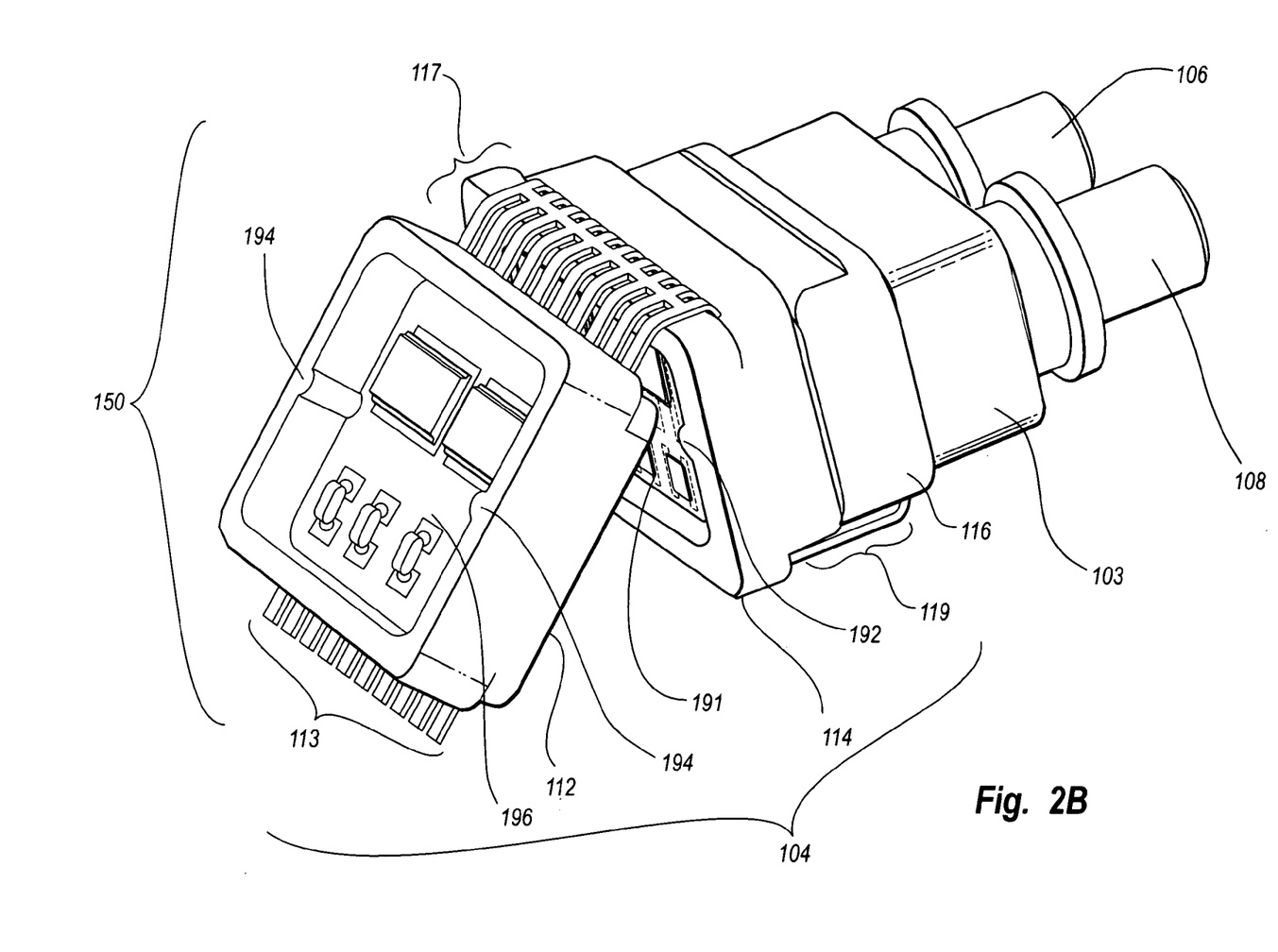
FIG. 2B illustrates an example of an assembled modular optical device including a dual stage fabricated package with digital diagnostics insert package.

FIG. 2B illustrates an example of an assembled modular optical device 150 including dual stage fabricated package with digital diagnostics insert package 104. As depicted, lens pins 106 and 108 are mechanically coupled to lens block 103. Lens block 103 is in turn mechanically coupled to fabricated package 116.

Figure 2C:
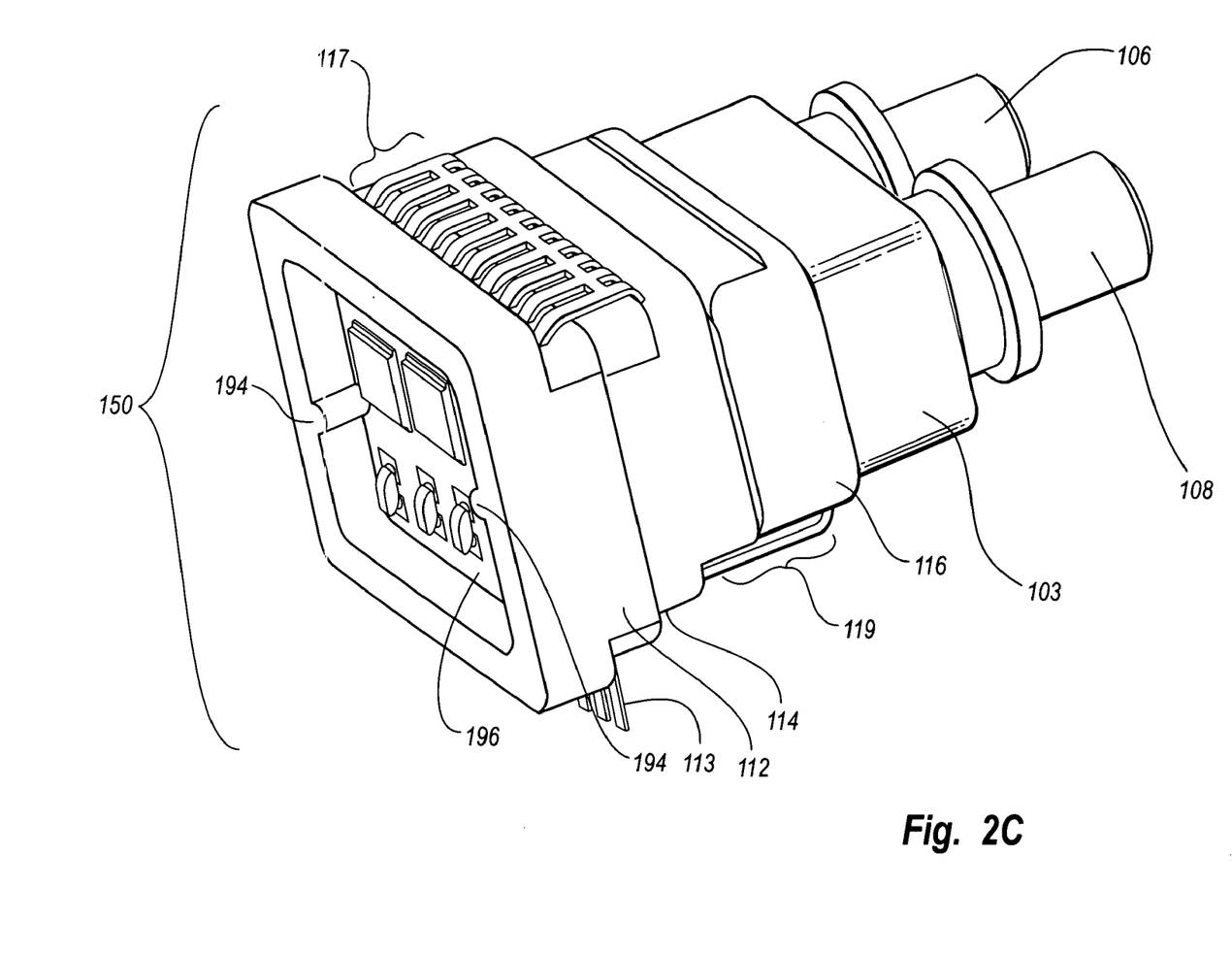
FIG. 2C illustrates an example of an assembled modular optical device including a dual stage fabricated package with digital diagnostics insert package in a fully formed configuration.

FIG. 2C illustrates an example of an assembled modular optical device 150 including dual stage fabricated package with digital diagnostics insert package 104 in a fully formed configuration. As depicted in FIG. 2C, leadframe 117 is completely bent.

Modular optical device 150 can be positioned on a printed circuit board assembly or other substrate. Leadframe portion 113 can facilitate electrical communication between circuitry on the substrate (or other components to which the modular optical device is attached) and modular optical device 150. Accordingly, leadframe portion 113 enables data transmission and/or data reception, as well as the transmission and reception of control and monitoring signals, between modular optical device and the substrate (or other appropriate components). Electrical communication can include communication between a light source included in fabricated package 116, such as, for example, VCSEL 151 and other circuitry on the substrate. Likewise, electrical communication can include communication between a light detector, such as, for example, photodiode 152, included in fabricated package 116 and other circuitry on the substrate. Similarly, electrical communication can include communication between circuitry of PCB inserts 191 and 196 (as well as other component inserts) and circuitry on the substrate.

Leadframe portion 113 can be connected to the substrate in a variety of ways, including, but not limited to, surface mount connectors, thru hole connectors, and compression-type connectors. A connected substrate can include an edge connector suitable for connecting the substrate to a corresponding receptacle in a computer system, for example, to establish a mechanical and electrical interface between the substrate and computer system bus. Alternately, the edge connector can facilitate establishment of a mechanical and electrical interface between modular optical device 150 and a variety of other devices, such as, for example, an optical router or optical hub.

Components (not shown), such as, for example, light emitting diodes, a laser driver, a post amplifier, a transimpedance amplifier, a current bias driver, volatile and/or non-volatile memory, and a thermo-electric cooler ("TEC") can be implemented on a transceiver PCBA or substrate. Components can be implemented on either side of the transceiver PCBA or substrate as appropriate. Components on a substrate can interface electrically with the modular optical device through leadframe portion 113. Components on a PCB insert can interface electrically with a substrate through leadframe portion 113 and with components in other fabricated packages through corresponding leadframe portions 117 and 119.

When the substrate is coupled to a computer system or other device, such implemented components can interface electrically with the computer system or other device. Mounting components, circuits and devices on both sides of the substrate or transceiver PCBA can facilitate a compact structure without any meaningfull loss in functionality. Moreover, as previously described, this aids space conservation on an HBA or other device to which the modular optical device is mounted.

The modular optical device 150 can be arranged on a substrate such that distance between lens pins 108 and 106 is sufficiently large such that a first optical connector can be connected to lens pin 106, while a second optical connector is simultaneously connected to lens pin 108 and vice versa. Generally, lens pins 106 and 108 can be configured to receive any of a variety of connectors, such as, for example, SC, LC, ST, and FC connectors. Other configurations of modular optical devices can be configured as appropriate to simultaneously connect to a corresponding number of optical connectors.

Generally, a HBA can be any type of printed circuit board implemented as a suitable connector interface for use with a computer system, wherein the connector interface may take the form of, for example, a peripheral component interconnect ("PCI") card having edge connectors configured and arranged to interface with a desktop computer system. The connector interface may alternatively take the form of, for example, a printed circuit board with a serial or parallel port, or a Personal Computer Memory Card International Association ("PCMCIA") standard card. Note that as used herein, "connector interface" generally refers to a PCB or other device that acts as an interface between an optical component, such as the modular optical device, and a host system such as a laptop computer, desktop computer, or portable computing systems such as personal digital assistants ("PDAs").

Figure 3A:
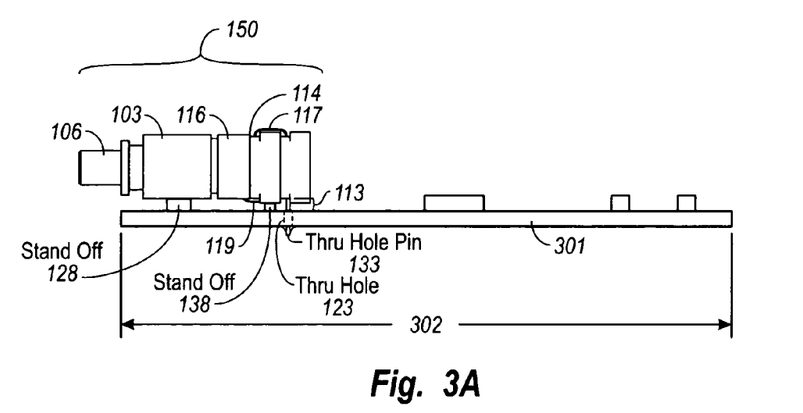
FIG. 3A illustrates an example side view of an assembled modular optical device package including dual stage fabricated package with digital diagnostics insert package coupled to a substrate.

Referring now to FIG. 3A, FIG. 3A illustrates an example side view of an assembled dual stage modular optical device 150 with leadframe 113 in a thru hole pin configuration. Modular optical device 150 includes fabricated package 112, fabricated package 114, fabricated package 116, leadframe portion 119, leadframe portion 117, lens block 103, lens pin 106, and lens pin 108 (which from the side view perspective in FIG. 3A is behind lens pin 106 and thus is not visible). Further, modular optical device 150 includes a thru hole pin configured leadframe 113, which can be an array of electrical pins suitable for connecting to substrate 301. Although not visible, printed circuit board insert 191 is contained in fabricated package 114 and printed circuit board insert 196 is contained in fabricated package 112. As depicted in FIG. 3A, substrate 301 has length 302.

Stand-offs 128 and 138 mechanically secure optical device 150 to substrate 301 and elevate modular optical device 150 so that leadframe portion 119 is not in direct contact with substrate 301. Stand-offs 128 and 138 can be separate pieces or can be integral features of lens block 103 and fabricated package 114 respectively. The relative size and position of stand-offs are approximate and can be varied based on package configuration.

As depicted in FIG. 3A, the thru hole pin configuration of leadframe 113 facilitates electrical communication between circuitry (not shown) on substrate 301 (or other components to which modular optical device 150 is mounted) and fabricated package 112, such as, for example, circuitry on PCB insert 196. To secure modular optical device 150 to substrate 301, pins of the thru hole pin configured leadframe 113 (e.g., thru hole pin 133 and other pins) can be inserted through thru holes (e.g., thru hole 123 and other thru holes) in substrate 301. Subsequently, thru hole pins can be mechanically and electrically coupled to substrate 301. Accordingly, a thru hole pin configured leadframe enables data transmission and/or reception, as well as the transmission and reception of control and monitoring signals, between fabricated package 112 and substrate 301 (or other appropriate components).

Figure 3B:
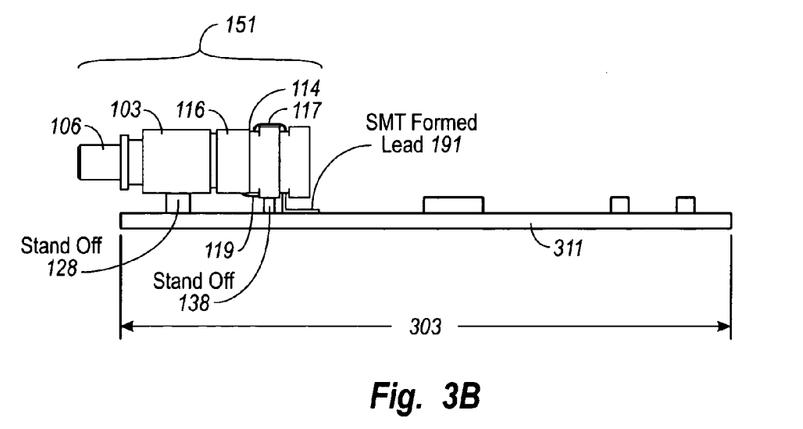
FIG. 3B illustrates an example side view of an alternate configuration of an assembled modular optical device package including dual stage fabricated package with digital diagnostics insert package coupled to a substrate.

FIG. 3B illustrates an example side view of an alternate configuration of dual stage modular optical device 151 positioned on substrate 311 that facilitates electrical communication between circuitry on substrate 311 (or other components to which modular optical device 151 is mounted) and fabricated package 112. In the embodiment of FIG. 3B, stand-offs 128 and 138 mechanically secure optical device 151 to substrate 311 and elevate modular optical device 151 so that leadframe portion 119 is not in direct contact with substrate 311. The relative size and position of stand-offs are approximate and can be varied based on package configuration. SMT (Surface Mount Technology) formed leadframe 191 electrically connects components of fabricated package 112 to components of substrate 311. As depicted in FIG. 3B, substrate 311 has length 303 similar to length 302.

Figure 3C:
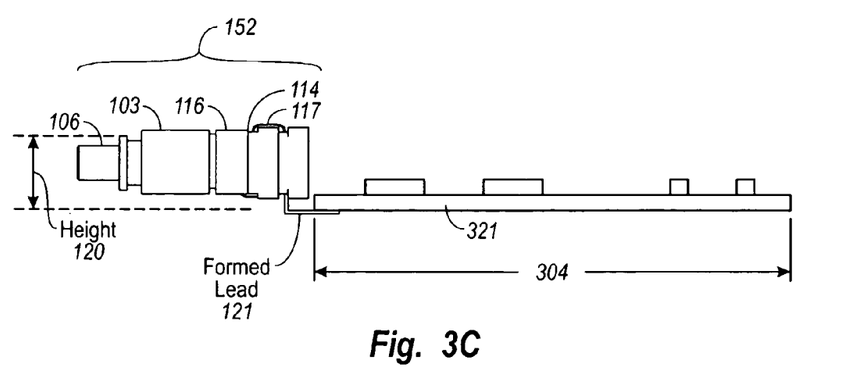
FIG. 3C illustrates an example side view of another alternate configuration of an assembled modular optical device package including dual stage fabricated package with digital diagnostics insert package coupled to a substrate.

FIG. 3C illustrates an example side view of another alternate configuration of modular optical device 152 positioned on substrate 321 that facilitates electrical communication between circuitry on a substrate 321 (or other components to which modular optical device 152 is mounted) and fabricated package 112. Formed leadframe 121 mechanically and electrically couples optical device 152 to substrate 321. The configuration of formed leadframe 121 along with the mounting point being on the underside of substrate 321, results in height 120 being reduced as compared to other configurations (e.g., those in FIGS. 3A and 3B). Further as depicted in FIG. 3C, length 304 is substantially reduced compared to lengths 302 and 303. An external support device, such as, for example, a mounting bracket can, be used to support modular optical device 152 in use.

As depicted in FIGS. 3A, 3B, and 3C, fabricated packages 112 and 114 are of essentially the same size and same configuration and leadframe portion 117 is in a completely bent configuration. However, it should be understood that fabricated package 112 can be of a different size and different configuration than fabricated package 114. For example, it may be that to accommodate additional components, fabricated package 112 is somewhat longer than fabricated package 114. To maintain a constant cross-sectional area leadframe portion 117 can be bent to some intermediate extent.

In some alternate mounting configurations, leadframe portion 117 is also bent to some intermediate extent. For example, when the plane of a substrate is in close proximity to the plane formed by the OSA optical axes, leadframe portion 117 may be bent to some intermediate extent. Bending leadframe portion 117 to an intermediate extent advantageously facilitates minimizing the length of leadframe portion 113.

Embodiments of the present invention have been described with respect to three separate fabricated packages (e.g., packages 116, 114, and 112). However, it would be apparent to one skilled in the art, after having reviewed this description, that embodiments of the present invention can include less than or more than three separate fabricated packages.

For example, it may be that a lead frame includes two fabricated packages. A first package may be similar to fabricated package 116 and a second package may be similar to fabricated package 114. Alternately, the second package can be of some other size and/or shape. A digital diagnostics component insert can be inserted into an insert opening (e.g., similar to insert opening 182) of the second fabricated package to implement digital diagnostics functions similar to those previously described. Another component insert (e.g., including a laser driver and/or transimpedance amplifier) can be inserted into another insert opening (e.g., similar to insert opening 118) to implement other processing as previously described It may also be that a lead frame includes four or more fabricated packages. At least one package can be configured similar to fabricated package 116. Other packages can be configured similar to either of packages 114 and 112 or can be of other sizes and shapes. A digital diagnostics component insert can be inserted into an insert opening (e.g., similar to insert opening 181) of one of the other packages to implement digital diagnostics functions similar to those previously described. Other packages can accept component inserts for other purposes, such as, for example, consolidating transmitter and receiver physical layer functions in a SerDes (serialization/deserialization) IC, signal conditioning using a CDR (clock and data recovery) IC, and adaptively compensating using an EDC (electronic dispersion compensation) IC. Packages can be connected to one another via leadframe portions.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be (embraced within their scope.

What is claimed and desired secured by United States Letters Patent is:

1. An modular optical device, comprising:
    a first fabricated package including at least one of a light source for generating optical signals and a light detector for detecting received optical signals;
    a second fabricated package with a first opening for receiving component inserts;
    a first leadframe portion that mechanically connects the first fabricated package to the second fabricated package and that electrically connects the at least one of the light source and light detector in the first fabricated package to first contacts of the first leadframe portion exposed in the first opening;
    a first component insert mechanically coupled to the second fabricated package and electrically coupled to the exposed first contacts such that components of the first component insert can electrically interoperate with the at least one of the light source and light detector;
    a third fabricated package with a second opening for receiving component inserts;
    a second leadframe portion that mechanically connects the second fabricated package to the third fabricated package and electrically connects the first exposed contacts to second contacts of the second leadframe portion exposed in the second opening; and
    a second component insert mechanically coupled to the third fabricated package and electrically coupled to the exposed second contacts such that components of the second component insert can electrically interoperate with components of the first component insert to implement digital diagnostics functions.

2. The modular optical device as recited in claim 1, wherein the first fabricated package includes a light detector for detecting optical signals.

3. The modular optical device as recited in claim 1, further comprising:
    a third leadframe portion mechanically and electrically connected to the second exposed contacts, the third lead fame portion facilitating mechanical and/or electrical connections between the modular optical device and external components.

4. The modular optical device as recited in claim 1, further comprising
a lens block mechanically coupled to the first fabricated package, the lens block configured such that one or more lens pins can mechanically couple to the lens block.

5. The modular optical device as recited in claim 4, further comprising:
a lens pin mechanically coupled to the lens block, the lens pin for directing an optical signal between a light source and corresponding external component.

6. The modular optical device as recited in claim 4, further comprising:
a lens pin mechanically coupled to the lens block, the lens pin for directing an optical signal between an external component and a corresponding light detector.

7. The modular optical device as recited in claim 1, wherein the first fabricated package includes a laser.

8. The modular optical device as recited in claim 7, wherein the first fabricated package includes a vertical cavity surface emitting laser.

9. The modular optical device as recited in claim 1, wherein the first fabricated package includes a photodiode.

10. The modular optical device as recited in claim 1, wherein the first fabricated package is a plastic fabricated package, the second fabricated package is a plastic fabricated package, and the third fabricated package is a plastic fabricated package.

11. The modular optical device as recited in claim 1, wherein the first component insert includes a laser driver circuit.

12. The modular optical device as recited in claim 1, wherein the first component insert includes a transimpedance amplifier circuit.

13. The modular optical device as recited in claim 1, wherein contacts of the first component insert are wired bonded to the first exposed contacts.

14. The modular optical device as recited in claim 1, wherein the first component insert is mechanically coupled to the second fabricated package with epoxy.

15. The modular optical device as recited in claim 1, wherein the first component insert includes one or more integrated circuits that are die attached and wire bonded to the component insert.

16. The modular optical device as recited in claim 1, wherein the first component insert includes one or more surface mount components that are surface mounted on the first component insert.

17. The modular optical device as recited in claim 1, wherein the second component insert includes components for implementing digital diagnostics functions.

18. The modular optical device as recited in claim 17, wherein components of the second component insert are configured to interoperate with components of the first component insert to implement one or more of: providing diagnostic information about a modular optical device's operating conditions, generating diagnostic data by digitizing analog modular optical device signals, internally calibrating the modular optical device, externally calibrating the modular optical device, issuing alarms, issuing warnings, retrieving vendor information, and querying the modular optical device for supported features.

19. The modular optical device as recited in claim 1, wherein the second component insert includes a processor.

20. The modular optical device as recited in claim 1, wherein the second component insert includes memory.

21. The modular optical device as recited in claim 1, wherein contacts of the second component insert are wired bonded to the second exposed contacts.

22. The modular optical device as recited in claim 1, wherein the second component insert is mechanically coupled to the third fabricated package with epoxy.

23. The modular optical device as recited in claim 1, wherein the second component insert includes one or more integrated circuits that are die attached and wire bonded to the second component insert.

24. The modular optical device as recited in claim 1, wherein the second component insert includes one or more surface mount components that are surface mounted on the second component insert.

25. The modular optical device as recited in claim 1, further comprising:
an external housing having dimensions in accordance with a small form factor pluggable form factor, the external housing surrounding the first fabricated package, the second fabricated package, the first leadframe portion, the first component insert, the third fabricated package, the second leadframe portion, and the second component insert.

26. The modular optical device as recited in claim 1, further comprising:
at least one other fabricated package; and
additional leadframe portions that mechanically connect the at least one other fabricated package to the third fabricated package.

27. An optoelectronic interface device comprising:
a host bus adapter having a printed circuit board with at least one connector for electrically interfacing with a host device; and
a modular optical device configured to mechanically and electrically interface with the host bus adapter, the modular optical device comprising:
a first fabricated package including at least one of a light source and a light detector;
a second fabricated package with a first opening for receiving component inserts that are to electrically interoperate with the at least one of a light source and a light detector;
a first leadframe portion that mechanically connects the first fabricated package to the second fabricated package and that electrically connects the at least one of a light source and light detector to first contacts of the first leadframe portion exposed in the first opening;
a first component insert mechanically coupled to the second fabricated package and electrically coupled to the first exposed contacts such that components of the first component insert can electrically interoperate with components included in the first fabricated package to transfer optical signals;
a third fabricated package with a second opening for receiving component inserts, the third fabricated package including a third leadframe portion for connecting the modular optical device to the host bus adapter;
a second leadframe portion that mechanically connects the third fabricated package to the second fabricated package and electrically connects the first exposed contacts to second contacts of the second leadframe portion exposed in the second opening; and a second component insert mechanically coupled to the third fabricated package and electrically coupled to the exposed second contacts such that components of the second component insert can electrically interoperate with components of the first component insert to implement digital diagnostics functions;

a lens block mechanically coupled to the first fabricated package, the lens block configured to receive one or more lens pins; and at least one lens pin mechanically coupled to the lens block, the at least one lens pin for transferring an optical signal between the at least one of a light source and a light detector and an external component.

28. The optoelectronic interface device as recited in claim 27, wherein the optoelectronic interface device is configured to be substantially received within a standard slot of the host device.

29. The optoelectronic interface device as recited in claim 28, wherein the standard slot comprises one of: a PCI card slot and a PCMCIA card slot.

30. The optoelectronic interface device as recited in claim 27, wherein the host bus adapter comprises a printed circuit board for one of: a peripheral component interconnect card and a PCMCIA card.

31. The optoelectronic interface device as recited in claim 27, wherein the first component insert is a laser driver PCB insert.

32. The optoelectronic interface device as recited in claim 27, wherein the second component insert is a digital diagnostics PCB insert.

33. The optoelectronic interface device as recited in claim 27, wherein components of second component insert are configured to interoperate with components of the first component insert to implement one or more of: providing diagnostic information about a modular optical device's operating conditions, generating diagnostic data by digitizing analog modular optical device signals, internally calibrating a modular optical device, externally calibrating a modular optical device, issuing alarms, issuing warnings, retrieving vendor information, and querying the modular optical device for supported features.

34. The optoelectronic interface device as recited in claim 27, wherein the second component insert includes a processor.

35. The optoelectronic interface device as recited in claim 27, wherein the second component insert includes memory.

36. A modular optical device comprising:

a first fabricated package including a laser and a photodiode;

a second fabricated package with a first opening for receiving component inserts;

a first leadframe portion that mechanically connects the first fabricated package to the second fabricated package and that electrically connects the laser and the photodiode to first contacts of the first leadframe portion exposed in the first opening;

a driver component insert mechanically coupled to the second fabricated package and electrically coupled to the exposed first contacts such that components included in the driver component insert can electrically interoperate with the laser and photodiode;

a digital diagnostics insert fabricated package with a second opening for receiving component inserts;

a second leadframe portion that mechanically connects the third fabricated package to the second fabricated package and electrically connects the first exposed contacts to second contacts of the second fabricated package exposed in the second opening;

a digital diagnostics component insert mechanically coupled to the third fabricated package and electrically coupled to the exposed second contacts such that components of the digital diagnostics insert can electrically interoperate with components of the driver component insert to implement digital diagnostics functions;

a lens block mechanically coupled to the first fabricated package and configured to receive a plurality of lens pins;

a first lens pin mechanically coupled to the lens block for directing an optical signal from the laser to an external component; and a second lens pin mechanically coupled to the lens block for directing an optical signal from an external component to the photodiode.

37. The modular optical device recited in claim 36, wherein the laser is a vertical cavity surface emitting laser.

* * * * *

UNITED STATES PATENT AND TRADEMARK OFFICE
CERTIFICATE OF CORRECTION

PATENT NO. : 7,284,916 B2
APPLICATION NO. : 11/151900
DATED : October 23, 2007
INVENTOR(S) : Sasser et al.

Page 1 of 3

It is certified that error appears in the above-identified patent and that said Letters Patent is hereby corrected as shown below:

Title Page
(57) ABSTRACT, change "with first" to --with a first--

Drawings
Replace Figure 2A with the figure depicted herein below, wherein "192" has been changed to --191-- and "199" has been changed to --192--

Fig. 2A

Signed and Sealed this
Twenty-eighth Day of December, 2010

David J. Kappos
*Director of the United States Patent and Trademark Office*

CERTIFICATE OF CORRECTION (continued)
U.S. Pat. No. 7,284,916 B2

Drawings
Replace Figure 3A with the figure depicted herein below, wherein --112-- and a line to the appropriate fabricated package have been inserted

Fig. 3A

Drawings
Replace Figure 3B with the figure depicted herein below, wherein --112-- and a line to the appropriate fabricated package have been inserted, "151" has been changed to --250--, and "191" has been changed to --213--

Fig. 3B

Drawings
Replace Figure 3C with the figure depicted herein below, wherein --112-- and a line to the appropriate fabricated package have been inserted, "152" has been changed to --350--, and "121" has been changed to --313--

Fig. 3C

CERTIFICATE OF CORRECTION (continued)
U.S. Pat. No. 7,284,916 B2

Column 1
Line 9, change "patent application" to --Patent Application--

Column 4
Line 11, change "including dual" to --including a dual--
Line 16, change "including dual" to --including a dual--
Line 20, change "including dual" to --including a dual--

Column 9
Line 61, change "reception" to --detector--

Column 11
Line 12, change "leadframe 117" to --leadframe portion 117--

Column 12
Line 31, change "leadframe 113" to --leadframe portion 113--
Line 38, change "leadframe 113" to --leadframe portion 113--
Line 53, change "leadframe 113" to --leadframe portion 113--
Lines 59-60, change "leadframe 113" to --leadframe portion 113--

Column 13
Line 5, change " 151" to --250--
Line 8, change "151" to --250--
Line 9, change "151" to --250--
Line 13, change "191" to --213--
Line 18, change "152" to --350--
Line 21, change "152" to --350--
Line 22, change "121" to --313--
Line 23, change "152" to --350--
Line 24, change "121" to --313--
Line 31, change "can, be" to --can be--

Column 14
Line 7, change "114 and 112" to --114 or 112--
Line 27, change "(embraced" to --embraced--
Claim 1, line 31, change "An" to --A--

Column 17
Claim 33, line 33, change "of second" to --of the second--

Column 18
Claim 36, line 18, change "digital diagnostics insert" to --third--